United States Patent [19]

Cox et al.

[11] Patent Number: 5,355,376
[45] Date of Patent: Oct. 11, 1994

[54] CIRCULAR VITERBI DECODER

[75] Inventors: Richard V. Cox, New Providence; Carl-Erik W. Sundberg, Chatham, both of N.J.

[73] Assignee: AT&T Bell Laboratories, Murray Hill, N.J.

[21] Appl. No.: 16,362

[22] Filed: Feb. 11, 1993

[51] Int. Cl.$^5$ .............................................. G06F 11/10
[52] U.S. Cl. ...................................................... 371/43
[58] Field of Search ................................... 371/43–46; 375/39, 75, 94; 341/107

[56] References Cited

U.S. PATENT DOCUMENTS

| | | | |
|---|---|---|---|
| 5,182,753 | 1/1993 | Dahlin | 371/43 |
| 5,208,816 | 5/1993 | Seshardi et al. | 371/43 |
| 5,287,374 | 2/1994 | Parr | 371/43 |

OTHER PUBLICATIONS

H. H. Ma and J. K. Wolf, "On Tail Biting Convolution Codes", IEEE Transactions on Communications, vol. 34, 104–111, Feb. 1986.

Q. Wang and V. K. Bhargava, "An Efficient Maximum Likelihood Decoding Algorithm for Generalized Tailbiting Convolutional Codes Including Quasicyclic Codes," IEEE Transactions on Communications, vol. 37, No. 8, 875–879, Aug. 1989.

G. Solomon and H. C. A. van Tilborg, "A Connection Between Block and Convolutional Codes," SIAM Journal on Applied Mathematics, vol. 37, No. 2, 358–369, Oct. 1979.

R. S. LeFever, "A New Class of Powerful, Viterbi Decodable, Block Codes," 1988 Tactical Communications Conference, Fort Wayne, Ind., Conf. Rec. 304–307.

K. Sh. Zigangirov and V. V. Chepyshov, "Study of Decoding Tailbiting Convolutional Codes," Proceedings, Fourth Joint Swedish–Soviet International Workshop on Information Theory, Aug. 1989, Gotland, Sweden, 52–55.

Clark and Cain, Error–Correction Coding for Digital Communications, Ch. 6 on "Convolutional Code Structure and Viterbi Decoding" pp. 227–266, 1981.

Primary Examiner—Jerry Smith
Assistant Examiner—Steven R. Garland
Attorney, Agent, or Firm—Thomas A. Restaino

[57] ABSTRACT

Branchwood signals are generated by a tailbiting convolutional coder. The receiver stores received branchword signals in memory such that the branchword signals are accessible in a logically circular sequence. The receiver then performs Viterbi updates on the logically circular sequence of branchwords, the sequence comprising more than N branchwords. The receiver stops performing Viterbi updates in response to an indication that update decisions have become repetitive. A set of generated decision vectors resulting from the Viterbi updates is then modified in response to the indication. A decoded signal is generated by performing a Viterbi traceback procedure using the modified set of decision vectors. The indication that Viterbi update decisions have become repetitive may be provided by a predetermined fixed number of Viterbi updates, the number reflecting an estimate of when said update decisions will likely become repetitive. The indication may also be provided by a comparison of decision vectors generated by Viterbi updates on the same stored branchword to determine whether the vectors are substantially equal. Or, the indication may be provided by a comparison of a pair of path metric vectors generated by Viterbi updates on the same stored branchword to determine whether differences between metric signals of one or more respective trellis state pairs of the path metric vectors are substantially equal. Modification of the set of generated decision vectors may include replacing a one or more decision vectors of the set with one or more later-determined decision vectors of the set.

9 Claims, 7 Drawing Sheets

CIRCULAR VITERBI DECODER

Field of the Invention

This invention relates to decoding of channel codes such as tailbiting convolutional codes.

BACKGROUND OF THE INVENTION

When information signals are communicated from a transmitter to a receiver via a communication channel, such information signals may be corrupted by noise associated with the channel. To help prevent such noise from corrupting the received information, a channel coding technique may be employed. Generally, coding which helps mitigate the effects of channel noise does so by introducing redundancy to the information to be communicated. Because of this redundancy, the likelihood that noise will corrupt communicated information is reduced.

Convolutional codes are a class of channel codes used to mitigate the effects of channel noise in the transmission of information. Convolutional codes are well known in the art and have been adopted as standards for certain types of communication systems. One example of such a standard is IS-54—a standard for North American digital cellular radio. IS—54 employs a type of convolutional code known in the art as a tailbiting convolutional code.

With tailbiting convolutional codes, a frame or block of information is encoded and communicated in a blockwise manner. The term "tailbiting" is used to refer to the fact that the coder begins and ends in the same coder state. The decoder is aware that the coder begins and ends in the same state, but is unaware of the value (or identity) of that state.

The maximum-likelihood decoder for the convolutional codes is known in the an as the Viterbi decoder. As is well known, the Viterbi decoder treats the problem of decoding a sequence of received symbols as a problem of finding the most likely sequence of uncorrupted symbols given an actual corrupted sequence received. The maximum-likelihood decoder for tailbiting convolutional codes employs Viterbi decoding, but can place great demands on computational resources. This is due to the fact that the decoder is unaware of the coder's starting state and must perform Viterbi decoding exhaustively for all possible starting states. As a result, suboptimal decoding techniques for tailbiting convolutional codes providing good levels of error protection with less computational burden are desirable.

SUMMARY OF THE INVENTION

The present invention provides a method and apparatus for decoding convolutional codes, such as tailbiting convolutional codes. Illustratively, a receiver embodiment of the invention receives a signal reflecting N branchwords, $c(m)$, $1 \leq m \leq N$, to decode. These branchwords comprise n symbols, for example binary-valued symbols. The branchwords are generated conventionally, for example, by a rate 1/n convolutional coder having $2^\gamma$ coder states, where $\gamma$ is the number of memory cells employed by the coder in generating branchwords. Illustratively, the coder employs a tailbiting convolutional code. The code to be decoded by the embodiment is capable of being represented by a state transition trellis, as is conventional. Each branchword therefore corresponds to the output of the coder reflecting the coder's transition from one trellis state to another via a trellis branch.

The embodiment decodes a block of received branchwords by performing a Viterbi update on each of a plurality of M branchword signals, $c(m)$, $1 \leq m \leq M$, $M \geq N$, wherein signal $c(m)$ is equal to signal $1 + (m-1) \mod N$ for $N < m \leq M$. The number of Viterbi updates, $m = M$, performed reflects a likelihood that further Viterbi updates, $m > M$, will not provide additional information to aid the decoding process. Each Viterbi update results in, inter alia, a decision vector, $v(m)$, which includes a plurality of indicator signals each reflecting a predecessor state for each state in the trellis at an update time. Once the M Viterbi updates are done, the embodiment replaces decision vectors, $v(m)$, $1 \leq m \leq M-N$, with decision vectors, $v(m)$, $N < m \leq M$. A decoded signal for the N received branchwords is generated by performing a Viterbi traceback procedure on the decision vectors, $v(m)$, beginning at time M and ending at time 1. Decoded bits are released during the traceback procedure beginning at time $m = N$ and ending at $m = 1$.

DETAILED DESCRIPTION

Introduction

Figure 1:
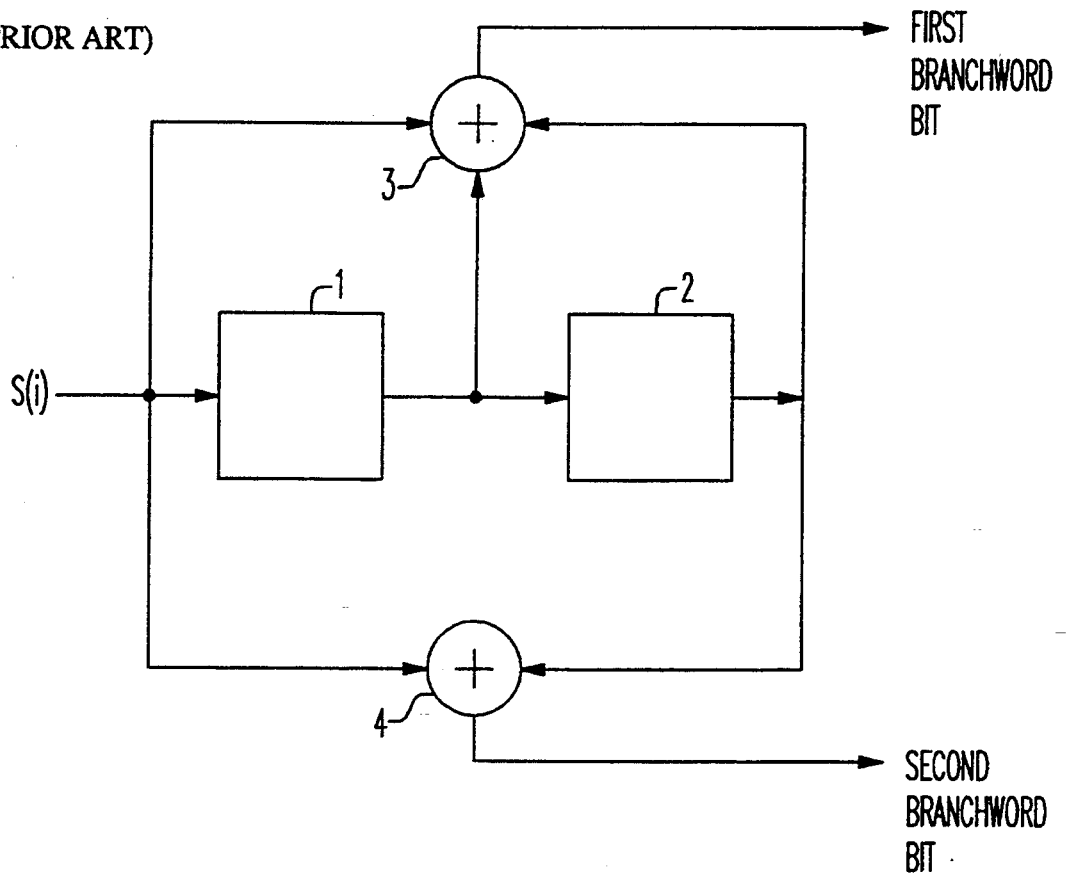
FIG. 1 presents a conventional rate ½ convolutional coder.

FIG. 1 presents an illustrative rate ½ convolutional encoder for use with the illustrative embodiment of the present invention. By "rate ½" it is meant that for every information bit to be coded, the coder produces two bits of output (i.e., a two-bit branchword). The encoder comprises two single-bit memory cells 1, 2 and two adder circuits 3,4. Memory cell 1 and adder circuits 3 and 4 receive a sequence of information bits, $s(i)$, to be encoded. Memory cell 1 provides its contents to memory cell 2 with each new information bit it receives. The encoder may be viewed as comprising an "upper" and "lower" path, each path including an adder circuit and connections to the information bit stream and one or both memory cells 1,2.

The output of the upper path of the encoder (that is, the path which includes adder circuit 3) comprises the first bit of a generated branchword. This output is generated by adding together the current bit and the two previous bits. If the resulting sum is odd, the adder 3 outputs a logical one; if the resulting sum is even, adder 3 outputs a logical zero. The output of the "lower" path (the path which includes adder circuit 4) comprises the second bit of the branchword. This output is generated by adding together the current bit and the bit which is two bits earlier than the current bit. Again, if the resulting sum is odd, adder 4 outputs a logical one; if the resulting sum is even, adder 4 outputs a logical zero. Since only three bits are used to determine an output branchword, this coder is said to have a "constraint length" of three. Its memory is two. The more output bits per input bit, and the longer the constraint length, the more powerful the code—that is, the more robust the code will be to channel noise.

Figure 2:
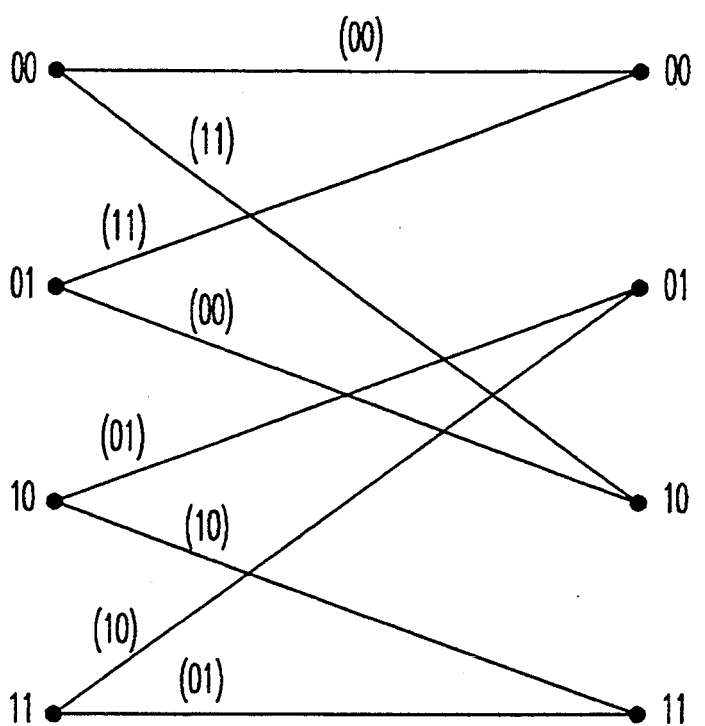
FIG. 2 presents a single state-transition trellis section reflecting the operation on the coder presented in FIG. 1.

The operation of the convolutional coder of FIG. 1 may be represented conventionally by a trellis diagram such as that presented in FIG. 2. The trellis describes how the states of the coder can change from one information bit time to the next. The coder state is simply the contents of the coder memory cells at any one time read as a state "word." On both the left and right sides of the trellis are the allowable states of the coder: 00, 01, 10, and 11. The states on the left side of the trellis represent the current state of the coder. The states on the right side of the trellis represent the next state of the coder.

So, for example, regardless of the value of a current bit, if the two previous bits are both zero (such that the contents of memory cells 1 and 2 are both 0), the coder is said to be in state 00 (which is the trellis node in the top left hand corner of the trellis). If the current bit is a one, the arrival of the next subsequent bit will mean that the coder transitions to state 10. That is, with the arrival of the next bit, the bit in memory cell 2 is replaced by the bit in cell 1 (a zero), and the bit in cell 1 is replaced by the current bit (a one). This transition is indicated by the diagonal line beginning at current state 00 at the top left of the trellis and extending downward and across to next state 10, the second state from the bottom on the left side of the trellis. With this state transition is an indication (in parentheses) of the output branchword of the coder—in this case, 11.

If the current bit were a zero instead of a one, the arrival of the next subsequent bit would mean that the coder "transitions" to the same state, 00 (see the horizontal line across the top of the trellis. As shown, the output of the coder would be a 00.

The trellis diagram indicates all allowable transitions in state by the coder. According to the diagram, for example, the coder cannot transition from state 00 to state 11 (note the absence of a line connecting state 00 on the left with state 11 on the right). This may be seen directly from the fact that states change one bit at a time.

Figure 3:
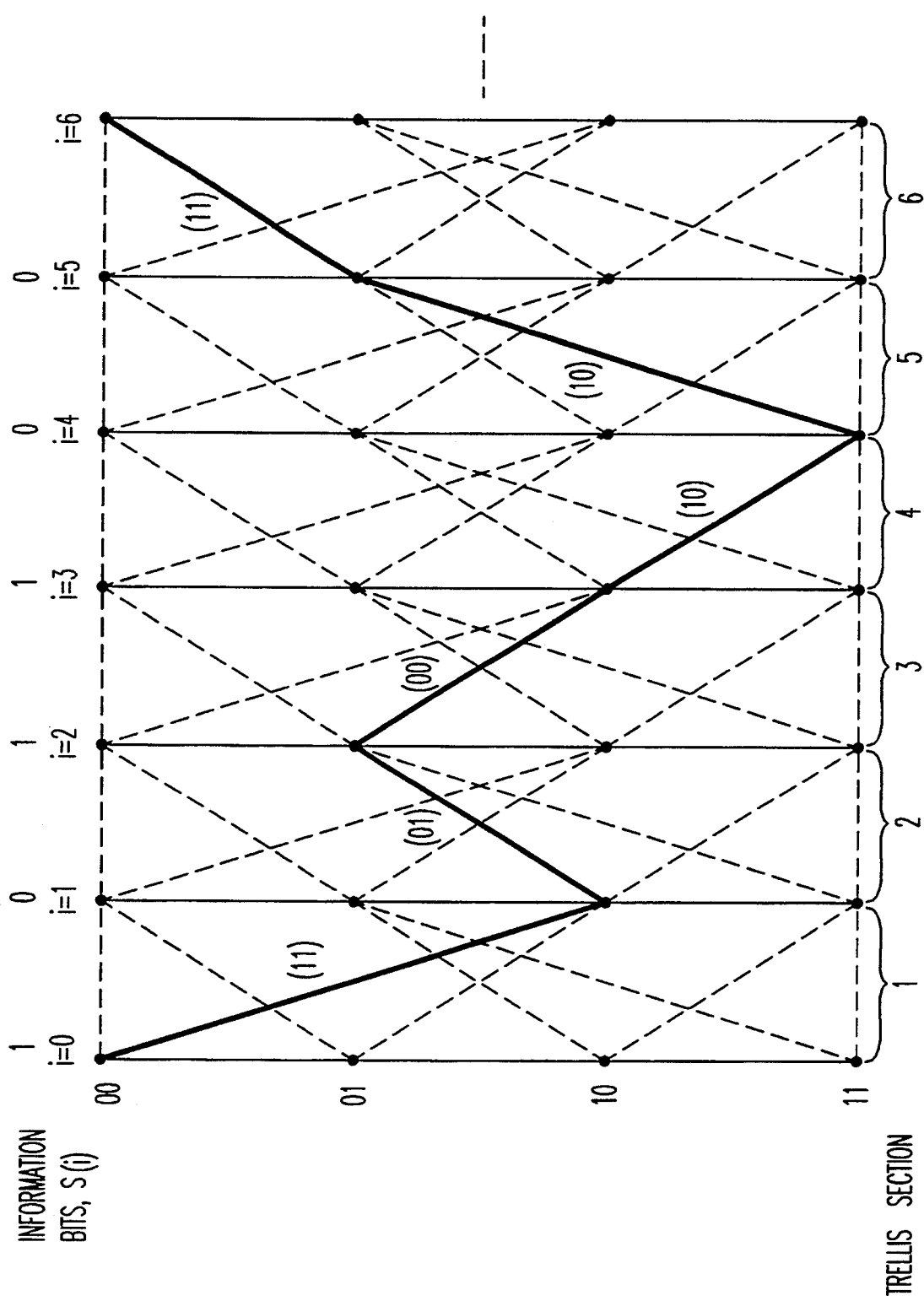
FIG. 3 presents a state transition trellis reflecting the operation of the coder of FIG. 1 given a particular starting state and information bits for coding.

Multiple trellises of the type presented in FIG. 2 are concatenated together (as is conventional) to form a trellis indicating a sequence of coder state transitions over time. The trellis of FIG. 3 represents the coding of the information bit sequence 101100 . . . by a coder starting in state 00. The trellis comprises six individual trellis sections of the type presented in FIG. 2. In the example of FIG. 3, the input bit stream causes the change of states indicated by the solid line, starting with state 00: 10, 01, 10, 11, 01, 11 . . . .. Discrete time, i, is indicated across the top of the trellis. The coder outputs the branchwords shown in parentheses: 11, 01, 00, 10, 10, 11 . . . .. Each of the state transitions indicated by the solid line traversing a trellis section is a legal transition corresponding to a given current state and an information bit to encode. Other potential legal state transitions are shown in dashed lines. These dashed lines are not relevant in the example of FIG. 3 since the example is predicated on a particular starting state and a particular sequence of bits to encode. Nevertheless, the dashed lines are presented for the sake of completeness and continuity with the general trellis of FIG. 2.

FIG. 3 illustrates two salient points regarding the representation of a coder with a trellis. First, for any given state in a trellis at a particular moment, i, in time, there are two predecessor states from which a transition to the given state can possibly occur. This may be seen from either FIGS. 2 or 3 where a state on the right side of a trellis section is associated with two states on the left side of the section by two transition paths. Second, given a particular starting state, any particular stream of information bits to be coded will result in a unique path through the trellis. These two points provide the basis for the application of Viterbi decoding of branchwords produced by a convolutional coder.

Codewords generated by the illustrative coder presented in FIG. 1 are communicated through a communication channel to a decoder. The job of the decoder is to determine the sequence of information bits which were coded by the coder. The determination is based on branchwords received by the decoder. Assuming a perfect communication channel and knowledge of the coder's starting state, this task is straight forward. The decoder employs a trellis of a type descriptive of the state transitions of the coder, and, knowing the starting state, uses the received branchwords to dictate state transitions taken by the coder when coding. Based on these state transitions, the sequence of bits causing such transitions may be determined.

As a general matter, perfect communication channels are not encountered in the real world. Therefore, real decoders must be able to cope with the fact that some of the branchwords received contain bit errors. For example, while the coder may generate a branchword 00, the decoder may receive a branchword 01. Thus, the decoder can be mislead in its knowledge of the sequence of states taken by the coder. Moreover, the decoder may not be aware of the coder's starting state. With imperfect knowledge of the coder's starting state and the sequence of subsequent states, the decoder may make errors in determining coder information bits.

As is well known in the art, the problem of channel errors are mitigated with use of a Viterbi decoder. A Viterbi decoder selects the most likely path through a coder trellis given branchwords which may contain bit errors. It can do so from any of a number of starting states (assuming the decoder has no knowledge of starting state). The selection of a most likely path is made progressively, one received branchword at a time. As a result of applying the Viterbi technique to each successive, received branchword, a path metric is maintained which reflects a likelihood that a path associated with that metric is the path actually taken by the coder.

As part of the determination of the best estimate of the path taken by the coder, a decision vector is generated which reflects for each state (at a given discrete time) which of two possible paths coming into the state is the better path. The vector records the "better path" decision for each state in the trellis. Paths which are not selected as a better path are said to be "pruned." Pruned paths will not have an effect on the final decoding of the branchwords. For the binary rate 1/n coding case, there are at most two paths which may enter a state. Therefore, the decision of which path to maintain and which path to prune may be represented by a single bit, as is conventional. In the illustrative embodiment of the encoder presented above in FIGS. 1 and 2 there are four states at each discrete point in time. Thus, at each such time, i, a decision vector of four bits is determined and saved in memory. Once the Viterbi technique has been applied to the received branchwords, the saved decision vectors provide the basis for a conventional Viterbi traceback procedure. It is this traceback procedure which decodes of the received branchwords. Further details of conventional Viterbi decoding are presented in Clark and Cain, *Error-Correction Coding for Digital Communications,* Ch. 6, especially §§6.2, 6.5, and 6.6 (1981), which is hereby incorporated by reference as if presented in full herein.

As stated above, the decoder's choice between two paths coming into a state is predicated on the value of path metrics. These metrics reflect the likelihood that a given path through the decoder's trellis is the actual path taken by the encoder, relative to other paths in the decoder trellis. Path metrics are updated with the arrival of each new branchword. To see how this is done, consider the state 00 in the top right corner of the trellis of FIG. 2. If state 00 at the top left was the actual predecessor of this state, then the bits transmitted over the channel would have been 00, assuming no channel errors. If state 01 was the predecessor, then the transmitted branchword bits would have been 11, again assuming no errors.

An illustrative conventional technique for updating path metrics, such as those associated with left hand states 00 and 01, is the Hamming metric. The Hamming metric determines how many bit errors (created by a noisy channel) must be presumed in order to account for a coder transition between, for example, left hand states 00 and 01 and top fight state 00, given the branchword actually received from the channel. Assume the path metric associated with the left hand state 00 is $R_1$ and the path metric associated with left hand state 01 is $R_2$. If branchword 00 is received, the update to the metric of the path which transitions between state 00 on the left and state 00 on the fight is zero (i.e., $R_1 = R_1 + 0$). This is because zero bit errors need to be presumed in order to account for this path transition by the coder. In other words, if the coder made this transition, a received branchword of 00 would be expected. Since a 00 was received, no errors are presumed. On the other hand, the update to the metric of the path which transitions between state 01 on the left and state 00 on the right is two (i.e., $R_2 = R_2 + 2$). This is because two bit errors need to be presumed in order to account for this path transition by the coder. If the coder actually made this transition, a received branchword of 11 would be expected. Since a 00 was received, two bit errors must be presumed for this transition.

Based on the updated path metrics, $R_1$ and $R_2$, one of the two paths entering state 00 on the fight side of the trellis section may be determined to be the path more likely to reflect the actual path taken by the coder. This is done, in this case, by selecting the path with the smaller metric value. The other path is pruned. The choice of paths at top fight state 00 is represented by a single bit. For example if the upper of the two paths had the lower total metric score (i.e., $R_1 < R_2$), the bit could be set to 0; if the lower path had the lower total metric score (i.e., $R_1 < R_1$), the bit could be set to 1. Should the path metrics be equal, a fixed decision rule is implemented which calls for always selecting either the upper or the lower path.

The above-described process for top right state 00 is repeated for each of the other right-hand states in the trellis section. As done above with right-hand state 00, a choice is made at each such state as to the better path. The determination of The result is a vector of four bits representing the decisions at this trellis section. This is the decision vector referenced above. After the above-described procedure is applied to each right-hand state in the trellis section, the next received channel branchword is considered. The process is repeated for each branchword received from the channel.

An Illustrative Embodiment

An illustrative embodiment of the present invention recognizes that regardless of a decoder's knowledge of the coder's starting state, unlikely paths through the trellis get pruned. This is because most communicated branchwords are received without being corrupted by the channel, and uncorrupted branchwords produce path metrics which are favorable to path metrics generated by corrupted branchwords.

The embodiment of the present invention employs conventional Viterbi decoding to decode a block of received branchwords. It does this by presuming equal starting state metrics and performing Viterbi updates for each received branchword. Each Viterbi update generates updated path metrics and a decision vector based on the metrics. When the embodiment reaches the end of the branchword block, it (i) uses the metrics updated through the last branchword as a set of "initial" metrics, and (ii) continues to perform Viterbi updates by treating the previously received block as a new block of branchwords. In this way, the block of branchwords is treated as circular. The advantage of this is that the last set of metrics of the block better reflects the likely coder starting state than does the initial set of metrics. By extending the Viterbi update process in this way, the embodiment of the present invention allows more time for unlikely paths to get pruned than would otherwise be available for decoding.

Figure 4A:
FIGS. 4(a) and (b) present equivalent views of a logical buffer of received branchwords for use by the embodiment of the present invention.
Figure 4A:
Figure 4B:
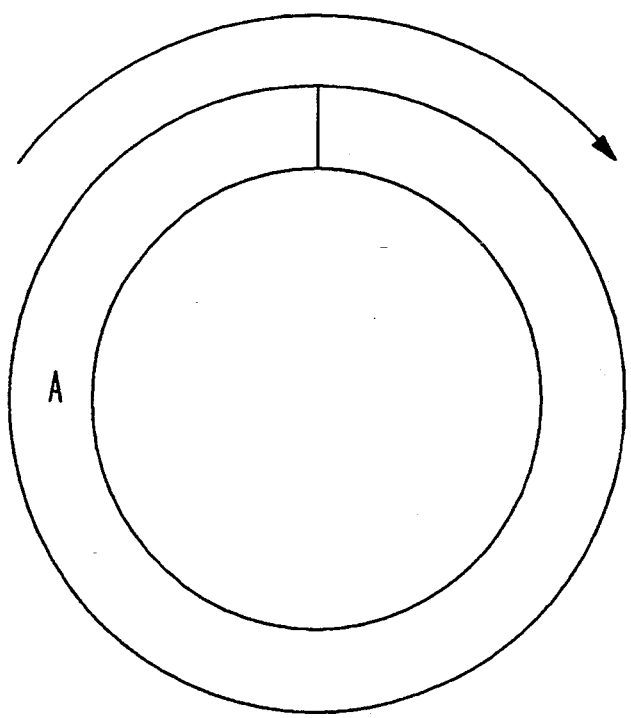

FIG. 4 presents two equivalent representations of the storage of a received branchword block in memory (RAM 33, below). FIG. 4(a) shows that the branchword block, A, may be repeated over and over as necessary to facilitate repeated "passes" through the block. Decision vectors resulting from Viterbi updates may be stored in a like fashion. FIG. 4(b) presents an alternative representation of the same concept. In FIG. 4(b), block A is shown as circular, such that its last branchword is made contiguous with its first branchword. Repeated "passes" through the block flow naturally from this representation.

While it may be possible to extend Viterbi updates of the block of received branchwords for an indefinite number of times, the embodiment of the present invention does not do so. Rather, the embodiment of the present invention stops the Viterbi update process responsive to a determination that continued Viterbi updates add no more information to the decoding process. This determination is based on detection of repeated Viterbi update decisions. In the example of the illustrative embodiment, these repeated decisions concern a sequence of Viterbi update decision vectors (from one pass through the received branchword block) which is identical to a sequence of decision vectors for the same branchwords from a previous pass through the branchword block. Once such identical sequences have been found, it means that all decision vectors from that point on will repeat. Continued Viterbi updates will add no new information to the decoding process. Therefore, the illustrative embodiment stops the circular update process and performs a traceback to decode the received bits.

The traceback procedure of the illustrative embodiment makes use of additional Viterbi updates (i.e., those updates beyond updates in a first pass through the branchword block) by replacing decision vectors from the first pass through the block with vectors from a later pass (e.g., the second pass). This replacement is performed because the decision vectors of the later pass reflect more reliable decisions regarding a best path through the trellis. The embodiment uses these decision vectors from the beginning of the second pass to the time when the vectors repeat as the replacement vectors. These vectors will replace an equal number of decision vectors beginning with the first vector of the first pass. The traceback then begins from the first of the repeated decision vectors of the second pass and proceeds backwards as is conventional. No bits are released until the traceback procedure reaches the last decision vector from the first pass through the block of received branchwords. Traceback continues, through original and replaced vectors, to the beginning of the vector of the block. At this point, decoding is complete.

Figure 5:
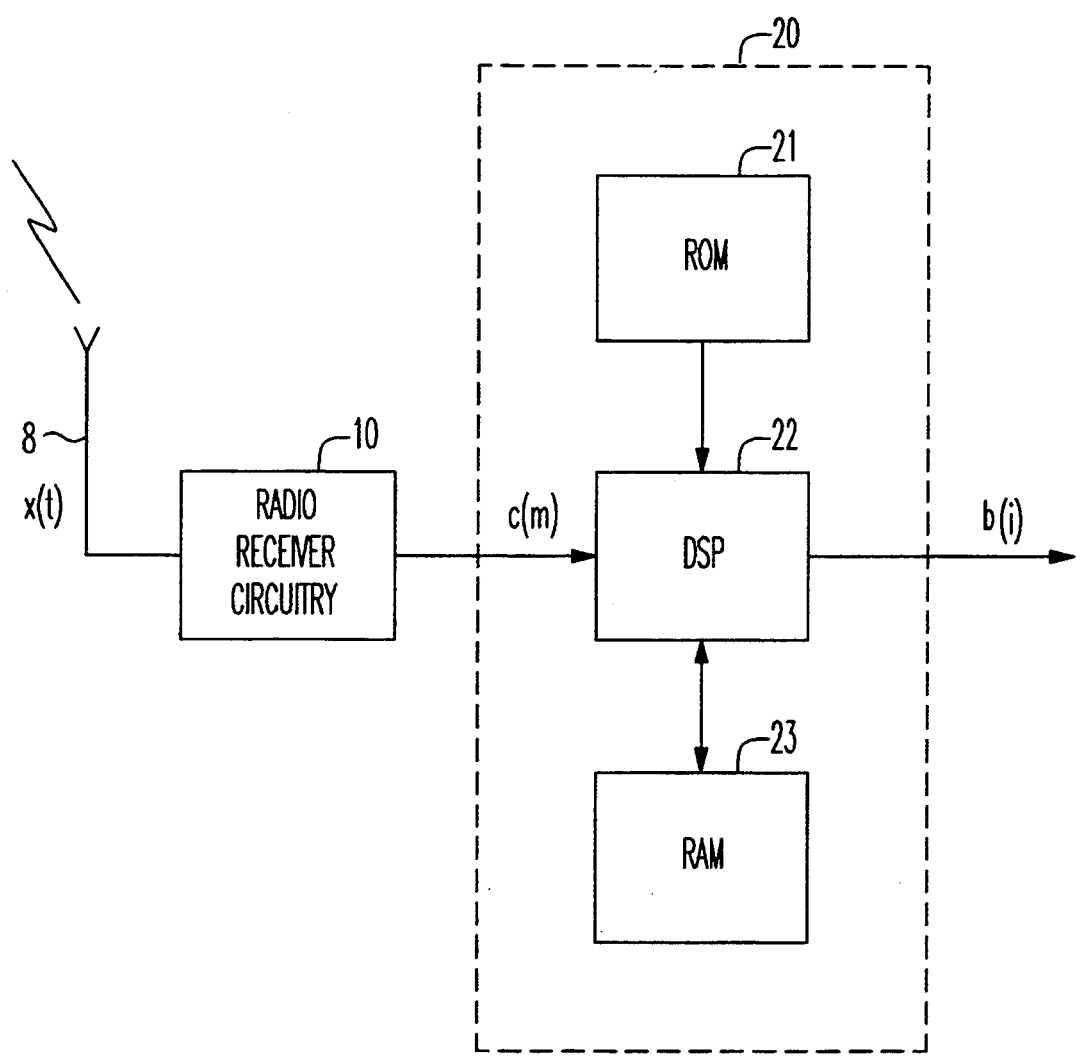
FIG. 5 presents an illustrative embodiment of the present invention.

FIG. 5 presents an illustrative embodiment 20 of the present invention in the context of a radio receiver system. The embodiment 20 is coupled to an antenna 8 and radio receiver 10 system which receives an analog radio signal, $x(t)$, and provides to the embodiment 20 digital branchwords at discrete times, $c(i)$.

The embodiment 20 comprises a digital signal processor (DSP) 22 coupled to read-only memory (ROM) 21 and random-access memory (RAM) 23. Illustratively, DSP 22 is the AT&T DSP16. ROM 21 stores, inter alia, software controlling the operation of DSP 22. An illustrative flow diagram of software stored in ROM 21 is presented in FIG. 6. RAM 23 stores, inter alia, a buffer of received branchwords for use by the present invention, as well as the results of Viterbi updates.

The illustrative embodiment 20 of the present invention operates to decode branchwords $c(i)$ received from the radio communication channel. These branchwords are generated by a coder employing a tailbiting convolutional code. Such a coder may be that described above with respect to FIGS. 1 and 2. Because the channel is noisy, the branchwords are imperfectly communicated. That is, the branchwords may contain one or more bit errors. The decoding operation of the embodiment 20 attempts to extract the communicated information from these branchwords.

Figure 6:
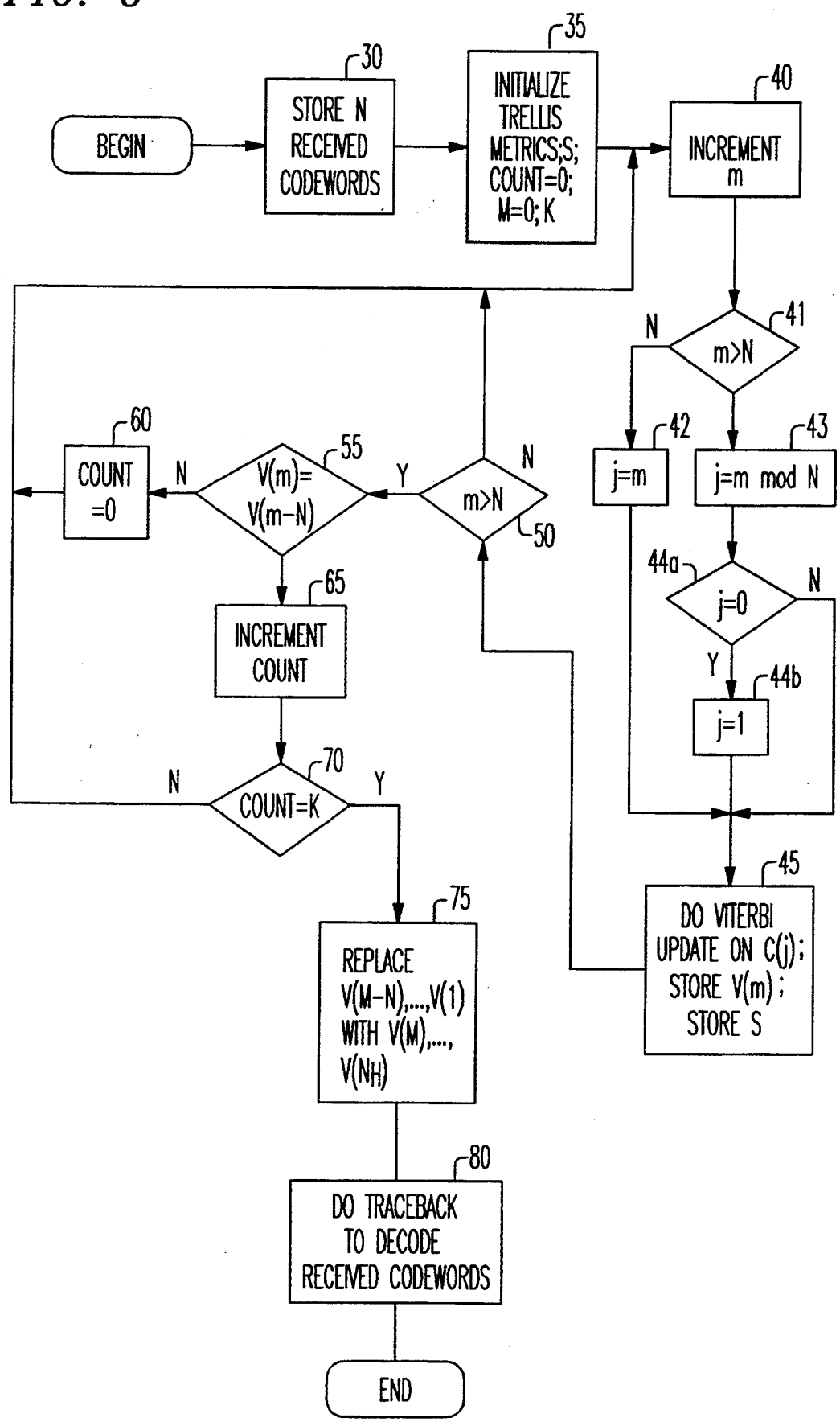
FIG. 6 presents an illustrative flow-diagram specifying the operation of the processor presented in FIG. 5.

Referring to FIGS. 4 through 6, embodiment 20 of the present invention receives a sequence of N branchwords, $c(m)$, $1 \leq m \leq N$, from radio receiver circuitry 10. According to step 30 of FIG. 6, these branchwords are stored in RAM 23 by DSP 22. Once the branchwords are stored, Viterbi updates may be performed by the DSP 22. As is conventional, a vector of initial path metrics, $S(1)$ through $S(4)$ (one for each decoder trellis state) is retrieved from ROM 21 for use in Viterbi updates. In the embodiment, the initial metrics for each path/state are the same. This identity of metrics reflects the fact that the receiver does not know the actual starting state of the coder in generating branchwords for transmission. Other initial metric loading techniques are possible, such as loading metrics for less than all states. In addition to initializing the metrics, DSP 22 initializes indices count and m as specified in process step 35. Index count is used to track the number of consecutive repetitive decision vectors generated from Viterbi updates (as discussed below) while m is a discrete-time index of received branchwords, and their corresponding decision vectors. A constant K is also initialized.

As shown in step 40, index m is incremented to refer to a given received branchword, $c(m)$ (and Viterbi update). At this point, DSP 22 performs a conventional Viterbi update on the indicated branchword, $c(m)$, as indicated by steps 41, 42, and 45. According to FIG. 6, this Viterbi update is actually performed on a branchword indexed by j. However, as shown in steps 41 and 42, for values of $m \leq N$, index j equals m.

The Viterbi update of step 45 is predicated on a trellis section of the type discussed above with reference to FIG. 2. As part of this update, the vector of path metrics, $S(1)$ through $S(4)$, is updated in a conventional manner such as that described above. In addition, a decision vector, $v(m)$, is conventionally formed to reflect which of two possible state transitions is the better for each state in the trellis at time m. As shown in step 45, both the updated state metric vector, S, and the decision vector at time m, $v(m)$, are stored in RAM 23. According to decision step 50, steps 40, 41, 42, and 45 (for a conventional Viterbi update) are repeated by DSP 22 in sequence for each of N received branchwords, $c(m)$, $1 \leq m \leq N$.

Eventually, DSP 22 will perform step 50 for $m=N$. As with previous Viterbi updates, step 50 will direct the flow of program control to step 40 for the purpose of incrementing m. As a result of this execution of step 40, m is set equal to $N+1$. The value of $m \leq N$ causes step 41 to direct the flow of control to step 43, rather than step 42 (as done previously). By operation of step 43, index j is set to m mod N. Because the Viterbi update of step 45 is performed on branchword $c(j)$, step 45 will update the trellis state metric vector, S, and form a decision vector, $v(m)$ based on $c(1)$ (since $1+(m-1)$ mod $N=1$, for $m=N+1$). (Steps 44a and b are included to prevent step 43 from causing a memory mismapping.) That is, additional Viterbi updates are performed based on repeated use of received branchwords such that $c(m)=c(1+(m-1)$ mod $N)$ for $m>N$. See FIG. 4, supra, and associated text. Unlike before, however, step 50 does not direct flow of control directly to step 40. Rather, flow of control is directed to step 55.

Step 55 determines whether the current decision vector, $v(m)$, is the same as a previous decision vector, $v(m-N)$. If not, count is set to zero (as specified by step 60) and control is passed to step 40. If $v(m)$ is equal $v(m-N)$, step 55 passes the flow of control to step 65 which increments count. Value count therefore "counts" the number of consecutive occurrences of $v(m)$ equalling $v(m-N)$. The value of count is then checked to determine whether the number of consecutive occurrences of $v(m)$ equalling $v(m-N)$ is equal to a constant, K. Illustratively, the value of K is greater than or equal to the number of memory cells of the coder in use. For example, where the number of memory cells equals 2 as here, K may be set equal to 4 or 5. As stated above, the value of K may be stored in ROM 21 and initialized during step 35. When count is not equal to K, the flow of control is passed back to step 40 and the process proceeds as discussed above.

Note that steps 55 and 60 insure that count reflects a number of consecutive occurrences of $v(m)$ equalling v(m−N). This is because any time v(m) is determined by step 55 not to be equal to v(m−N), the value of count is set to zero by step 60.

Should the value of count be equal to K as determined by step 70, the flow of control is directed to step 75. Step 75 replaces decision vectors v(M−N), . . ., v(1) with decision vectors v(M), . . ., v(N+1), where M is the value of index m at which updates have stopped responsive to step 70. This replacement of decision vectors is done to supplant vectors reflecting early path pruning decisions which were made based on metrics which likely did not reflect the best path. Recall that the initial state metrics did not effectively distinguish between starting states.

Figure 7:
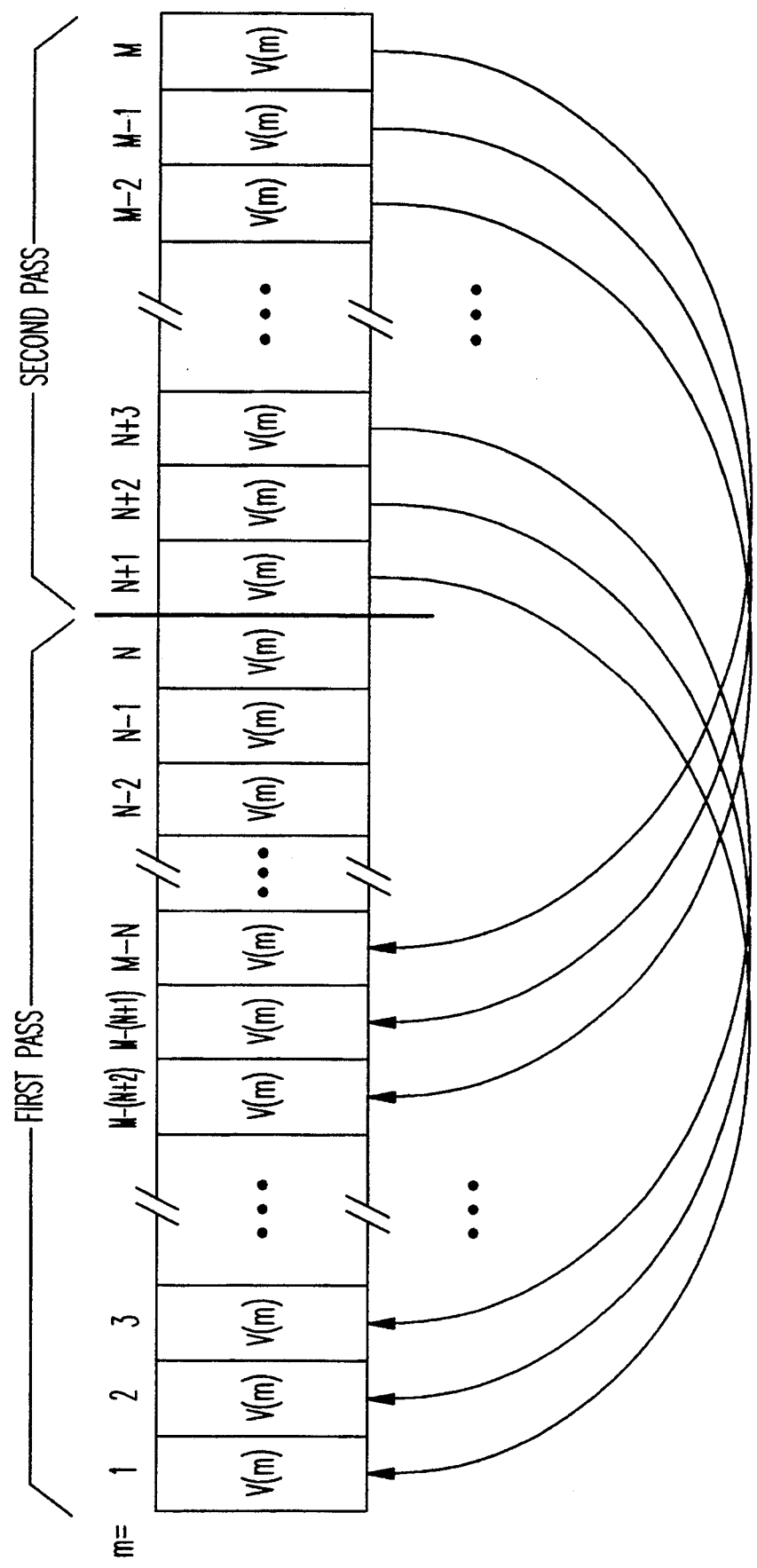
FIG. 7 illustrates a decision vector replacement technique of the illustrative embodiment.

FIG. 7 illustrates the replacement of decision vectors, v (m), according to the illustrative embodiment. The Figure shows a set of decision vectors stored in RAM 23, v(1), . . ., v(N), associated with a first pass of Viterbi updates through the received branchword block, where there are N such branchwords in the block. The Figure further shows a second set of decision vectors, v(N+1), . . ., v(M), associated with a second pass through the received branchword block. The value of M is that value of index m when the update process stopped as per step 70. As is indicated by the arrows, the vector v(N+1) replaces the vector v(1); the vector v(N+2) replaces v(2); and so on through vector v(M) replacing v(M−N). An illustrative FORTRAN program for implementing the replacement of decision vectors (i.e., step 75) is as follows:

```
  l=M−N
1 l=l−1
  IF (l.EQ.0) GO TO 2
  v(l)=v(l+N)
5 GO TO 1
2 CONTINUE
``` where l is the index of replacement.

Once the decision vectors have been replaced according to step 75, a conventional Viterbi traceback procedure through the decision vectors is performed to decode the received branchwords. The traceback begins with vector v(m) at its state with the best metric and proceeds backwards as is conventional. Decoded bits are not released until the procedure reaches v (N). Thus, the decoded bits are determined based on the traceback over the interval from m=N to m=1. The procedure waits to release bits until m=N because by that time in the traceback procedure, it is likely that the traceback will be on the best path through the trellis.

The Viterbi update stopping rule concerning the relationship of decision vectors resulting from different passes through a branchword block is merely illustrative of stopping rules which reflect a likelihood that further Viterbi updates will not provide additional information to aid the decoding process. Other stopping rules may also be used to achieve or approximate the same result.

For example, if path metric vectors, S, are saved in RAM 23 after each Viterbi update, these vectors may be used as the basis of a stopping rule. The embodiment described above may be modified to check for a relationship between the path metric elements of S(m) and S(m−N). In particular, the difference in metric values between all corresponding elements of two such metric vectors may be computed. The term "corresponding elements" refers to metric values of the same state. If the difference between each of the four (for example) corresponding elements of S(m) and S(m−N) is the same, and if this set of identical differences is repeated for several metric vectors in a row, the Viterbi update process may be stopped. The principles of the present invention are applicable to decoders employing "soft decisions." When applying this stopping rule to a decoder employing soft decisions, the term "identical differences" should be interpreted to mean differences within a predetermined tolerance.

A further alternative of the stopping rule of the illustrative embodiment is to combine the above two rules into one. That is, Viterbi updates shall continue until both the above rules are satisfied. Yet another stopping rule is to fix the number of Viterbi updates to be performed, M, so as to approximate the point at which further Viterbi updates are unlikely to provide additional information for the decoding of received branchwords. So, for example, one of the nonfixed stopping rules may be performed several times for a given coder and a given channel. Based on these performance trials, a fixed estimate for the number of updates needed may be determined. For example, a worst case value for M may be chosen for the fixed stopping point.

Figure 8:
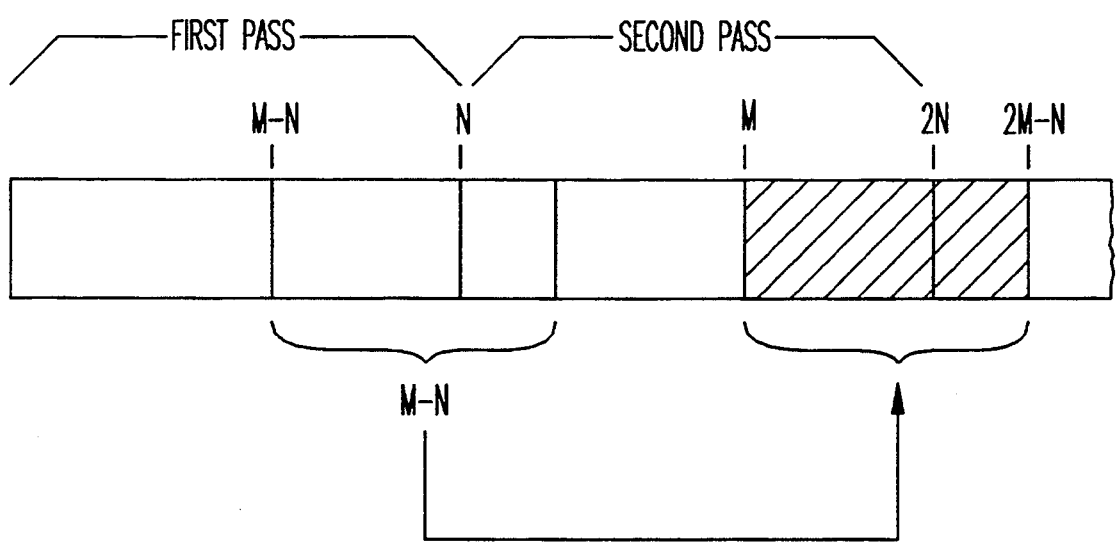
FIG. 8 illustrates an alternative decision vector replacement technique to that presented in FIG. 7.

It should further be understood that the replacement of decision vectors by the embodiment is merely an illustration of how a set of decision vectors generated by the Viterbi update process may be modified in accordance with the present invention. In light of the above discussion, those of ordinary skill in the art will recognize that other modifications to this set are possible. For example, rather than copy decision vectors "backward" from the second pass to supplant decision vectors from a first pass (as shown in FIG. 7), the same number of vectors resulting from updates from the latter part of the first pass and extending into the beginning of the second pass may be copied "forward" to the provide vectors beyond the point at which updates have stopped. Such an alternative modification of vectors is shown in FIG. 8. Note that as used here, the term "modification" contemplates copying decision vectors to provide decision information which would otherwise have to be determined in the course of a second or third pass through the branchword block. As with the previous case, decision vectors of the second pass, v(N+1),.. . ., v(M), reflect "good" decisions. Furthermore, vectors v(M−(N−1)) ..... v(N) from the end of the first pass also reflect "good" decisions. A number M−N "good" vectors—beginning with those at the end of the first pass and extending to the "good" vectors of the second pass—may be used to extend the set of generated decision vectors beyond the Viterbi update stopping point, M. See FIG. 8. In this way, traceback may begin at v(2M−N) and proceed backward to v(M—(N−1)), with decoded bits being released beginning with vector v(M) in the traceback.

It should be understood that the stopping rules discussed above are directed to the avoidance of superfluous Viterbi updates. Such avoidance reduces decoding processing time and power consumption. Consequently, Viterbi updates are usually stopped somewhere in between the boundaries of a branchword block.

Although the illustrative embodiment of the present invention concerns the decoding of a tailbiting convolutional code provided by a coder having two memory cells, it will be understood by those of ordinary skill in the art that the invention is applicable to other coders of tailbiting convolutional codes, such as that specified by IS-54 (which is a rate ¼ code with 32 states). Moreover, the present invention is applicable to other types of convolutional codes (including nonbinary, optimal high rate, punctured, etc.) and block codes, such as quasicyclic block codes.

It should be understood that the principles of the present invention are applicable to so-called "generalized tailbiting" convolutional codes. Like the tailbiting codes discussed above, generalized tailbiting codes are generated by a coder which begins and ends in the same state. While the decoder is not aware of the identity of such state, the decoder is aware that such state is among a known subset of all coder states.

We claims:

1. A method of operating a receiver to decode N received branchword signals, $c(j)$, $1 \leq j \leq N$, the method comprising the steps of:
   a. storing the received branchword signals in memory such that said signals are accessible in a logically circular sequence;
   b. performing Viterbi updates on a logically circular sequence of branchwords, the sequence comprising more than N branchwords, the Viterbi updates generating a set of decision vectors;
   c. stopping the performance of said Viterbi updates responsive to an indication that Viterbi update decisions have become repetitive;
   d. modifying the set of generated decision vectors responsive to said indication; and
   e. generating a decoded signal by performing a Viterbi traceback procedure using the modified set of decision vectors.

2. The method of claim 1 wherein the code is a convolutional code.

3. The method of claim 2 wherein the convolutional code is a tailbiting convolutional code.

4. The method of claim 1 wherein the indication that Viterbi update decisions have become repetitive comprises a predetermined fixed number of Viterbi updates, said number reflecting an estimate of when said update decisions will likely become repetitive.

5. The method of claim 1 wherein the indication that Viterbi update decisions have become repetitive is provided by comparing decision vectors generated by Viterbi updates on the same stored branchword to determine whether said vectors are substantially equal.

6. The method of claim 1 wherein each Viterbi update further provides a vector of path metric signals, the vector including a path metric signal for each of a plurality of trellis states, and wherein the indication of repetitive Viterbi update decisions is based on the step of comparing a pair of path metric vectors generated by Viterbi updates on the same stored branchword to determine whether differences between metric signals of one or more respective trellis state pairs of said path metric vectors are substantially equal.

7. The method of claim 6 wherein the indication that Viterbi update decisions have become repetitive is further based on the step of comparing decision vectors generated by Viterbi updates on the same stored branchword to determine whether said vectors are equal.

8. The method of claim 1 wherein the step of modifying the set of generated decision vectors comprises the step of replacing a one or more decision vectors of the set with one or more later- determined decision vectors of the set.

9. The method of claim 1 wherein the step of modifying the set of generated decision vectors comprises the step of extending the set of decision vectors by repeating previously determined decision vectors of the set.

* * * * *